United States Patent

[11] 3,609,412

[72] Inventor Tomisaburo Okumura
Kyoto, Japan
[21] Appl. No. 858,468
[22] Filed Sept. 16, 1969
[45] Patented Sept. 28, 1971
[73] Assignee Matsushita Electronics Corporation
Osaka, Japan
[32] Priority Sept. 19, 1968
[33] Japan
[31] 43/6897

[54] INTEGRATED IGFET SIGNAL CONVERTER CIRCUIT
3 Claims, 6 Drawing Figs.

[52] U.S. Cl. .... 307/304,
317/235 G, 332/14 T, 330/35, 317/235 B
[51] Int. Cl. .... H01l 19/00
[50] Field of Search .... 317/235
(21.1), 235 (22.2); 307/304, 205, 233, 251, 279;
330/35; 332/14 T; 328/134

[56] References Cited
UNITED STATES PATENTS

| | | | |
|---|---|---|---|
| 3,355,598 | 11/1967 | Tuska | 317/235 |
| 3,406,298 | 10/1968 | Axelrod | 317/235 |
| 3,456,169 | 7/1969 | Klein | 317/235 |

*Primary Examiner*—Jerry D. Craig
*Attorney*—Stevens, Davis, Miller & Mosher

ABSTRACT: An integrated circuit element comprising two insulated-gate field-effect transistors connected in parallel and another insulated-gate field-effect transistor connected in cascade thereto, which works stably as a converter, e.g. a local oscillator or a frequency converter element in a radio or television receiver and which can be easily designed because few outgoing electrode lead wires are necessary for integration.

T. OKUMURA

INVENTOR

BY Stevens, Davis, Miller & Mosher ATTORNEYS

INTEGRATED IGFET SIGNAL CONVERTER CIRCUIT

This invention relates to a signal converter circuit using three insulated-gate field-effect transistors.

An object of this invention is to operate a frequency converter circuit effectively with a local oscillation of low voltage.

Other objects, features and advantages of this invention will become more apparent from the following detailed description of this invention when taken in conjunction with the accompanying drawings, in which.

Figure 1:
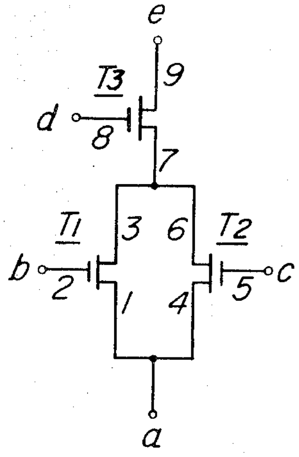
FIG. 1 is a diagram showing the principle of the structure of a signal converter circuit according to this invention.

Referring to FIG. 1, which shows the structure of a circuit according to this invention, T1, T2 and T3 indicate active elements or insulated-gate field-effect transistors (hereafter referred to as IGFET) composing the device of this invention. The element T1 has a source 1, a gate 2 and a drain 3, T2 has a source 4, a gate 5 and a drain 6 and T3 has a source 7, a gate 8 and a drain 8.

In FIG. 1, each IGFET of T1, T2 and T3 is connected as follows; the source electrodes 1 and 4 of T1 and T2 are connected in common, and the drain electrodes 3 and 6 are connected in common to the source electrode 7 of T3. Accordingly, only five terminals consisting of the common source electrode terminal *a* of T1 and T2, the gate electrode terminal *b* of T1, the gate electrode terminal *c* of T2, the gate electrode terminal *d* of T3 and the drain electrode terminal *e* of T3 are taken out of the device. Thus, outgoing lead wires are made as few as possible and the device is easy to fabricate.

Figure 2:
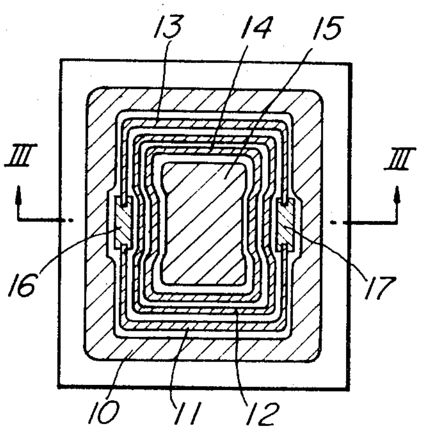
FIG. 2 is a plan view of a solid-state integrated circuit device according to this invention.
Figure 3:
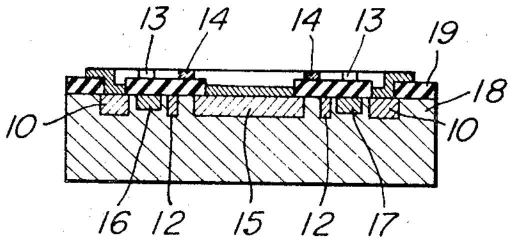
FIG. 3 is a sectional diagram of the same device.

FIGS. 2 and 3 are a plan view and a fragmentary sectional diagram showing an embodiment of an integrated circuit device composed by integrating the elements shown in FIG. 1.

Description will be made by comparison of FIGS. 1 and 2. Numeral 10 of FIG. 2 corresponds to the common source region 1, 4 of T1, T2 shown in FIG. 1, numeral 11 of FIG. 2 corresponds to the gate 2 of T1 in FIG. 1, and numerals 12, 13, 14 and 15 of FIG. 2 correspond to the common region consisting of 3, 6 and 7, the gate 5 of T2, the gate 8 of T3 and the drain region 9 of T3, respectively. The first and second transistors are provided in the periphery so as to surround the third transistor connected in cascade. The regions 16 and 17 in FIG. 2 are formed for a particular purpose useful in the integration of the elements shown in FIG. 1. Namely, in FIG. 2, the gate electrode 11 (corresponding to the gate 2 of T1 in FIG. 1) and the gate electrode 13 (corresponding to the gate 5 of T2 in FIG. 1) must be insulated from each other and the electrodes themselves are placed separately on an insulating film of the substrate surface. However, an inactive conducting channel is easily formed on the substrate surface under said insulating film and a current which is not controlled by said gate electrodes 11 and 13 runs between the regions 10 and 12. Thus, in order to prevent said inactive conducting channel from forming, high-concentration impurity regions 16 and 17 having the same conductivity type as that of the substrate are formed in the substrate under the insulating film corresponding to the region between said gate electrodes 11 and 13. FIG. 3 is a sectional diagram of the device cut along the line III—III of FIG. 2 and the same reference numerals indicate the same units. In addition, a semiconductor substrate 18 and an insulating film 19 are shown.

The regions 16 and 17 described hereinabove are particularly necessary when a so-called depletion mode IGFET is used. They are indispensable, e.g. in case of an N-channel type depletion mode MOS transistor. However, these regions are not always necessary in case of a characteristic division called an enhancement mode.

Now, the performance of the above circuits according to this invention will be described. In the circuit of FIG. 1, a high frequency voltage is applied to the electrode terminal *b* of the gate 2 of T1, a local oscillation voltage is applied to the electrode terminal *c* of the gate 5 of T2 and suitable voltages are applied to the electrode terminals *b*, *c* and *e* with respect to the terminal *a*.

Then, the high frequency voltage is amplified at T1, the local oscillation voltage is amplified at T2, and they are sent to T3. The gate 8 of T3 is grounded through an AC connection and the T3 performs a common gate-type of operation.

As will be apparent from the foregoing description, both the high frequency voltage and the local oscillation voltage are amplified until the frequency conversion is effected in a frequency converter circuit according to this invention. Thus, a low local oscillation voltage is sufficient. The problem of the radiation of unnecessary electromagnetic waves from the local oscillator inherent in a circuit according to the prior art is thus solved. According to an experiment, the mixed output for T1 input or the ratio of the medium frequency voltages reached a factor of 29 when the oscillation voltage was 0.3 v. Further, since a low local oscillation voltage is sufficient in the present circuit, coupling between the local oscillator and T2 may be loose and the stability of the oscillation frequency of said local oscillation may be kept high.

Though T2 is used for amplifying local oscillation in the above embodiment, it is evident that T2 may be used also as a local oscillator.

Figure 4:
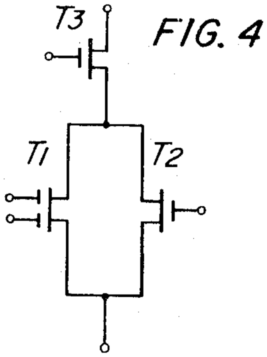
FIGS. 4 through 6 show the arrangements of other circuits for illustrating the principle of this invention.
Figure 5:
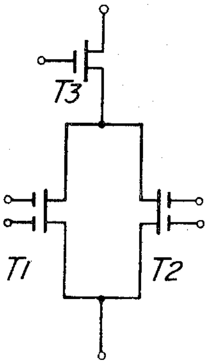
Figure 6:
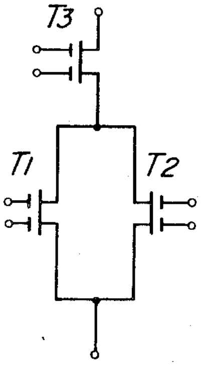

FIGS. 4 through 6 show other embodiments of this invention which employ a double-gate IGFET (tetrode MOS transistor). The radiations from local oscillations can be further inhibited by these devices.

As has been described in detail hereinabove, the signal converter circuit of this invention makes it possible to operate a frequency converter circuit stably with a low local oscillation voltage and the structure thereof is advantageous for integration.

What is claimed is:

1. A signal converter device comprising first and second insulated gate-type field-effect transistors connected in parallel with each other having a common source electrode and a common drain electrode, said first and second field-effect transistors being supplied at gate electrodes thereof with a high frequency input signal and a carrier wave signal respectively, a third insulated gate-type field-effect transistor connected in cascade to said drain electrode common to the first and second field-effect transistors so that a signal resulting from mixing the high frequency input signal and the carrier wave signal is derived as an output signal from an output terminal of said third field-effect transistor.

2. An integrated signal converter circuit according to claim 1, wherein each transistor is formed in a single semiconductor substrate, the first and second transistors connected in parallel are provided in the periphery so as to surround the third transistor connected in cascade, and high-concentration impurity diffusion regions for preventing conducting channels from being formed having the same conductivity type as that of the substrate are formed in the surface of the substrate just under and across parts at which the gate electrodes of said first and second transistors are oppositely adjacent to each other so as to eliminate the interaction between said gate electrodes.

3. A circuit according to claim 2, wherein at least one of said first, second and third transistors is an insulated gate-type field-effect transistor comprising two gates.

UNITED STATES PATENT OFFICE
CERTIFICATE OF CORRECTION

Patent No. 3,609,412 Dated September 28, 1971

Inventor(s) Tomisaburo Okumura

It is certified that error appears in the above-identified patent and that said Letters Patent are hereby corrected as shown below:

Japanese patent application number in the claim for priority should read 43/68976 instead of 43/6897.

Signed and sealed this 21st day of March 1972.

(SEAL)
Attest:

EDWARD M.FLETCHER,JR.
Attesting Officer

ROBERT GOTTSCHALK
Commissioner of Patents

ORM PO-1050 (10-69)

USCOMM-DC 60376-P69
☆ U.S. GOVERNMENT PRINTING OFFICE : 1969 O—366-334